(12) United States Patent
Mangeot (10) Patent No.: US 9,876,444 B2
(45) Date of Patent: Jan. 23, 2018

(54) WOBBLE MOTOR WITH A SOLID STATE ACTUATOR

(71) Applicant: Noliac A/S, Kvistgaard (DK)

(72) Inventor: Charles Edouard Mangeot, Hillerod (DK)

(73) Assignee: Noliac A/S, Kvistgaard (DK)

( * ) Notice: Subject to any disclaimer, the term of this patent is extended or adjusted under 35 U.S.C. 154(b) by 380 days.

(21) Appl. No.: 14/410,988

(22) PCT Filed: Jun. 28, 2013

(86) PCT No.: PCT/EP2013/063684
§ 371 (c)(1),
(2) Date: Dec. 23, 2014

(87) PCT Pub. No.: WO2014/005949
PCT Pub. Date: Jan. 9, 2014

(65) Prior Publication Data
US 2015/0155799 A1    Jun. 4, 2015

(30) Foreign Application Priority Data

Jul. 5, 2012 (DK) .................................. 2012 70397

(51) Int. Cl.
*H02N 2/10* (2006.01)
*H01L 41/09* (2006.01)
*H02N 2/14* (2006.01)

(52) U.S. Cl.
CPC ............. *H02N 2/105* (2013.01); *H02N 2/147* (2013.01); *H01L 41/0966* (2013.01); *H02N 2/14* (2013.01)

(58) Field of Classification Search
CPC .................................. H02N 2/10; H02N 2/105
See application file for complete search history.

(56) References Cited

U.S. PATENT DOCUMENTS 3,928,778 A * 12/1975 Ivanov ..................... B23Q 1/36
                                                    250/442.11
4,523,120 A *  6/1985 Assard ................ H01L 41/0993
                                                    310/317

(Continued)

FOREIGN PATENT DOCUMENTS

DE    102008021904 A1    11/2009
EP        1143535 A1    10/2001

(Continued)

OTHER PUBLICATIONS

International Search Report PCT/ISA/210 for International Application No. PCT/EP2013/063684 dated Dec. 2, 2013.

(Continued)

*Primary Examiner* — J. San Martin
(74) *Attorney, Agent, or Firm* — Harness, Dickey & Pierce, P.L.C.

(57) ABSTRACT

An wobble motor with an actuator extending in a Z direction between opposite mount and tool ends and comprising two sections offset in that Z direction. Each section comprises a structure of electrodes interleaved in a piezoelectric material in such a way that a Y-region can cause deflection in a Y-direction perpendicular to the Z-direction upon energizing of associated electrodes and such that a X-region can cause deflection in an X-direction perpendicular to the Y and Z directions upon energizing of associated electrodes.

13 Claims, 5 Drawing Sheets

(56) References Cited

U.S. PATENT DOCUMENTS

| | | | |
|---|---|---|---|
| 5,144,187 A * | 9/1992 | Culp | H02N 2/105 310/323.02 |
| 5,237,234 A * | 8/1993 | Jebens | H02N 1/004 310/309 |
| 5,747,915 A * | 5/1998 | Benavides | H02N 2/105 310/306 |
| 6,184,609 B1 * | 2/2001 | Johansson | H01L 41/0906 310/328 |
| 6,246,052 B1 * | 6/2001 | Cleveland | B82Y 35/00 250/234 |
| 7,026,745 B2 | 4/2006 | Dames | |
| 7,695,389 B2 * | 4/2010 | Fleytman | H02N 2/105 310/328 |
| 7,923,901 B2 * | 4/2011 | Gottlieb | H02N 2/105 310/12.01 |
| 2001/0038258 A1 | 11/2001 | Fischer et al. | |
| 2004/0007944 A1 | 1/2004 | Johansson et al. | |
| 2004/0017134 A1 | 1/2004 | Ganor | |
| 2007/0138915 A1 | 6/2007 | Mulvihill et al. | |
| 2010/0156242 A1 | 6/2010 | Blume et al. | |
| 2011/0109198 A1 * | 5/2011 | Asada | H02N 2/02 310/328 |

FOREIGN PATENT DOCUMENTS

| | | | |
|---|---|---|---|
| EP | 1523049 A2 | | 4/2005 |
| JP | H0298033 A | | 4/1990 |
| JP | 2014168376 A | * | 9/2014 ............... H02N 2/02 |

OTHER PUBLICATIONS

Written Opinion of the International Searching Authority PCT/ISA/237 for International Application No. PCT/EP2013/063684 dated Dec. 2, 2014.

* cited by examiner

WOBBLE MOTOR WITH A SOLID STATE ACTUATOR

CROSS-REFERENCE TO RELATED APPLICATIONS

This application is a national phase under 35 U.S.C. §371 of PCT International Application No. PCT/EP2013/063684 which has an International filing date of Jun. 28, 2013, which claims priority to Danish patent application number DK PA 2012 70397, filed on Jul. 5, 2012; the entire contents of each of which are hereby incorporated by reference.

The invention relates to a wobble motor with an actuator working according to the principles of Piezoelectricity, Electrostriction and/or magnetostriction where the motion is caused by contraction or expansion of a material based on an electric or magnetic field. Herein such actuators will simply be referred to as "solid state actuators". Particularly, the invention relates to a wobble motor comprising at least one solid state actuator each comprising a body extending primarily in a Z direction between opposite mount and tool ends. The wobble motor further comprises a wobble structure comprising a shaft being rotatable about a longitudinal axis and at least one ring arranged about the shaft. The ring is operatively associated with the tool end of the at least one actuator such that the ring can be manipulated by movement of the tool end relative to the mount end.

BACKGROUND OF THE INVENTION

Electrostriction is a property of all electrical non-conductors, or dielectrics that causes them to change their shape under the application of an electric field. Magnetostriction is a property of ferromagnetic materials that causes them to change their shape or dimensions during the process of magnetization. Electrostriction and magnetostriction can be used for actuation purposes, and today a large variety of transducers operate according to these basic principles. Due to a very simple and reliable structure, solid state actuators of this kind are made in large numbers for various Applications. As an example, they may replace step-motors in servo-systems or they may be used in many different control applications for exact positioning of light beams, mirrors, or valves, etc.

Typically a solid state actuator is very limited with regard to the ability to move an end effector relative to a base. Typically, it will be able to provide movement of the end effector within a very short range, typically with relative modest force, and typically, they have low kinematic capabilities. In fact, often they are only capable of conducting a linear movement in the direction of the expansion or compression.

Various attempts have been made to improve the range of movement, the force which can be exerted, or to improve the kinematic capabilities.

Bending actuators of solid state type have been used in different designs in multifarious applications in industry for many years. They are characterized by a small design format, low energy requirements, and high reliability. Thus, for example, a piezoelectric bending actuator exhibits a service life of at least $10^9$ cycles in the industrial environment. However, the kinematic capabilities are limited, and more particularly, the end effector of a solid state bender cannot move in a flat plane but only in a spherical plane.

In U.S. Pat. No. 7,026,745, an actuator is proposed with a laminate structure which provides deflection in two different directions when energised appropriately.

In US 2010/0156242, an actuator drive structure is proposed where two solid state elements cooperate to provide rotational movement of the end-effector.

In US 2007/0138915A1, a wobble motor is presented where a shaft is driven in rotation by a structure generally extending in a Z direction, bendable in two directions perpendicular to the Z direction. The active elements thereby have a narrow range of movement of the actuators, and the end-face of the structure becomes non-planar due to the bending.

SUMMARY

To improve wobble motors, the invention, in a first aspect, provides a wobble motor with an actuator having a body which forms a first section being offset from a second section in the Z direction. Each section is capable of deflecting in a Y direction which is perpendicular to the Z direction. Each section is further capable of deflecting in an X direction which is perpendicular to the Y direction and perpendicular to the Z direction.

Due to the two sections offset in the Z direction, it becomes possible to move the tool end in any pattern defined in a flat plane. Accordingly, the tool end can move in the X and Y directions of a Cartesian coordinate system without the negative effect caused by the bending of the tool end.

Each section may comprise at least one Y-region with a laminate of Y-electrodes interleaved in piezoelectric material in such a way that energising of the electrodes causes the deflection in the Y direction; and at least one X-region with a laminate of X-electrodes interleaved in piezoelectric material in such a way that energising of the X-electrodes causes the deflection in the X direction.

The regions are provided such that a deflection in a Y direction, the Y direction being perpendicular to the Z direction and perpendicular to the X direction, occurs when the Y-electrodes are energised, and such that a deflection in an X direction, the X direction being perpendicular to the Y and Z direction, occurs when the X-electrodes are energised.

Figure 4A:
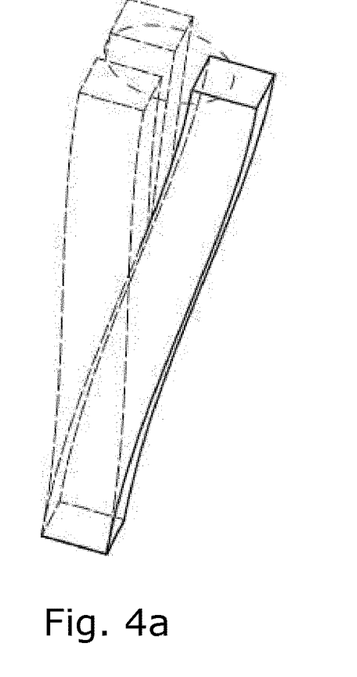
FIGS. 4a and 4b illustrate a combination of positions of the tool end forming a circle.
Figure 4B:
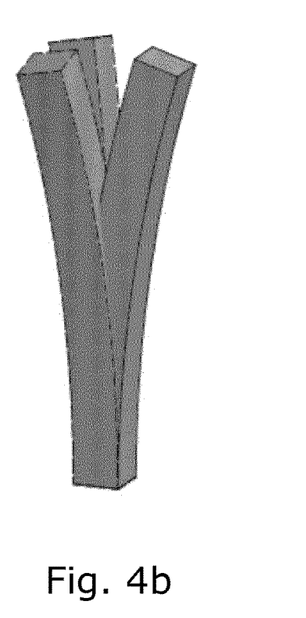

To provide a sequential application of an electrical potential, the actuator may comprise a controller which can control a connected X-energizer and Y-energizer. Particularly, this controller may be adapted to effect Cartesian movement of the tool end relative to the mount end. For this purpose, the specific sequence may be applied. The sequence is disclosed later with reference to FIG. 4.

By operatively associated is herein meant that the at least one actuator is arranged relative to the ring such that the ring can be manipulated by the actuator. The actuator could be fixed to the ring, e.g. by a connection between the tool end and the ring, or the actuator and ring may not be fixedly connected but simply able to interact such that the ring is moved by movement of the tool end relative to the mount end.

By "energizing" is herein meant that an electrical potential sufficient to cause deflection of the solid ceramic body is established between different electrodes in the body—typically between adjacent electrode layers.

By "offset in the Z direction" is herein meant that one section follows another section in the Z direction. The two sections which are offset in the Z direction may follow directly one after the other, e.g. in an embodiment where they are directly attached to each other, or they may be separated by intermediate sections, e.g. by a passive section with no piezoelectric effect.

In one embodiment, the actuator and the ring are joined in a flexible coupling which allows re-orientation of the ring relative to the actuator.

In another embodiment, the actuator and the ring are fixed to each other in a non-flexible coupling. They could e.g. be glued together or they could be joined via any number of interface components interposed between the actuator and the ring.

In any event, the connection between the actuator and ring may be suitable for transferring movement in a Cartesian X-Y plane perpendicular to the elongated Z direction of the actuator, whereas relative movement of the actuator relative to the ring in other planes not necessarily are transferred. Particularly, the coupling may prevent rotation of the ring in the X-Y plane relative to the actuator.

Particularly, the shaft and the ring are arranged to interact with each other to effect rotation of the shaft upon manipulation of the ring. Particularly, the ring may be moved by the at least one actuator in an eccentric pattern relative to the shaft in such a way that the outer surface of the shaft engage the inner surface of the ring, i.e. the outer surface of the shaft and inner surface of the ring are in contact with each other and such that friction, toothed, or other interaction between these surfaces causes rotation of the shaft as a consequence of the eccentric movement of the ring about the shaft. Eccentric herein means that the axis of the shaft is not concentric with the ring.

For this purpose, the inner surface of the ring and outer surface of the shaft may have mating surface portions, e.g. in the form of toothed surface portions or similar uneven surface portions by which the ring can manipulate the shaft such that the shaft rotates within the ring. Accordingly, the ring may have an internal toothing and the shaft may have an external tooting which matches the internal tooting in size and shape. In an alternative embodiment, the inner surface of the ring and outer surface of the shaft interact by friction.

At least one of the rings or each ring may have a curved outer surface, e.g. an axial end face of the ring could be concave or convex, e.g. a peripheral outer surface. The tool end could be attached to this concave or convex surface thereby facilitating easier orientation of the ring relative to an associated actuator or actuators.

Each ring or at least one of the rings could be made of several independent rings arranged radially about each other like rings in a radial bearing. In this embodiment, one of the rings could be manipulated by the associated at least one actuator while the other one could manipulate the shaft. Herein, these rings will be referred to as the "manipulated ring" and the "manipulating ring". The manipulated ring could e.g. be a radial outer one of the rings. This ring could be joined with, or fixed to the at least one associated actuator, or the associated actuator may at least come in contact with this manipulated ring.

The manipulated ring and the manipulating ring may be rotatable relative to each other. This could be useful e.g. if one ring is provided for driving the shaft and the other rings are provided for suspension purpose, i.e. for holding the shaft in a rotatable manner. Alternatively, or additionally, the manipulated ring and the manipulating ring may be movable relative to each other about other axes, e.g. to enable that the rings can move away from parallel relative location to a non-parallel location.

In a second aspect, the invention provides a method for driving a shaft, which comprises the steps of: providing a solid state actuator comprising a body extending primarily in a Z direction between opposite mount and tool ends, arranging a ring about a shaft and displacing the ring periodically by use of the tool end of the actuator while the ring engages the shaft such that the shaft thereby rotates within the ring. The method being characterised in that the actuator is formed with a body having a first section (13) being offset from a second section (14) in the Z direction, such that each section is capable of deflecting in a Y direction being perpendicular to the Z direction and in an X direction being perpendicular to the Y direction and perpendicular to the Z direction.

Generally, the method may apply any solid state actuator with the claimed two sections, and particularly of the kind where the body is formed such that each section comprises at least one Y-region with a laminate of Y-electrodes interleaved in piezoelectric material in such a way that energising of the electrodes causes the deflection in the Y direction; and at least one X-region with a laminate of X-electrodes interleaved in piezoelectric material in such a way that energising of the X-electrodes causes the deflection in the X direction.

Particularly, the electrodes may be energised to cause tool end to follow a circle shaped path. And particularly, the ring may be displaced by periodic movement of the tool end of the actuator. By periodic movement is herein meant that the actuator repeats a certain pattern of movement.

The invention may further provide a controller, e.g. integrated in a power supply for an actuator and a wobble motor as described above. Particularly, a controller which is capable of energizing the X-electrodes and the Y-electrodes in a sequence whereby the tool end moves in a Cartesian space being perpendicular to the oblong Z-direction of the actuator. Particularly, the controller may be programmable such that a repeatable sequence can be established. In this way, controlled movement of the actuator and thus of the wobble motor may be obtained.

DETAILED DESCRIPTION

In the following, embodiments of the invention will be described by way of an example with reference to the figures in which.

Further scope of applicability of the present invention will become apparent from the following detailed description and specific examples. However, it should be understood that the detailed description and specific examples, while indicating preferred embodiments of the invention, are given by way of illustration only, since various changes and modifications within the scope of the invention will become apparent to those skilled in the art from this detailed description.

Figure 1:
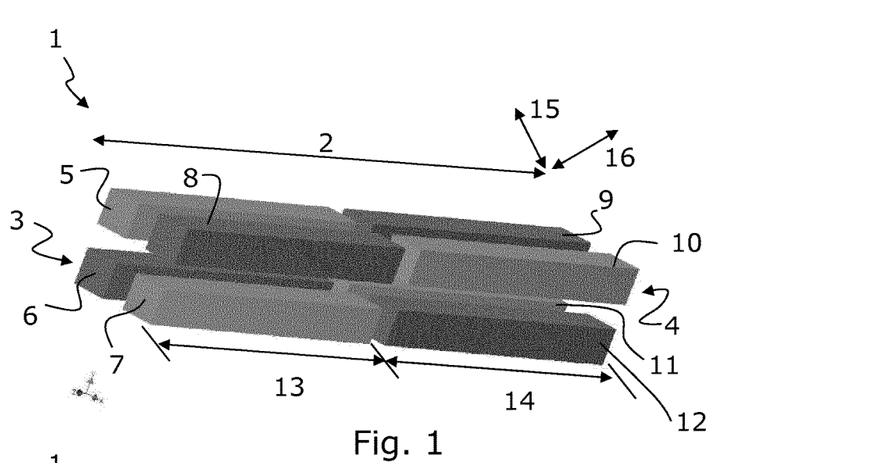
FIG. 1 illustrates an exploded view of an actuator for a wobble motor according to the invention.

FIG. 1 illustrates schematically, an actuator in an exploded view. The actuator 1 extends primarily in a Z direction indicated by the arrow 2. The actuator has axially opposite end faces 3, 4 which herein will be referred to as mount end 3 and tool end 4. The actuator has eight actuator portions 5, 6, 7, 8, 9, 10, 11, 12 where a first section of the actuator, indicated by the arrow 13 comprises the portions 5, 6, 7 and 8. And a second section, indicated by the arrow 14, comprises the portions 9, 10, 11 and 12. The first and second sections are axially offset relative to each other and joined directly to each other, one after the other in the Z direction.

Each portion of a section corresponds to a particular direction of displacement. In FIG. 1, portions 5 and 7 form Y-regions and portions 6 and 8 form X-regions. The Y-regions are adapted to bend in the Y-direction indicated by arrow 15 and being perpendicular to the Z direction (indicated by arrow 2). Correspondingly, the X-regions are adapted to bend in the X-direction (indicated by arrow 16 and being perpendicular both to the Y-direction and to the Z-direction).

To effect the bending, each portion comprises a laminate of electrodes being interleaved in a body of a piezo-ceramic material. Every second layer of electrodes is connected to zero and every other second layer of electrodes is connected to a power supply which can provide an electrical potential between adjacent electrodes. This structure is generally referred to as a "piezo-electric" bender. The bending in the specific direction is caused by the specific arrangement of the electrodes in the ceramic body and polarisation direction for the portion in question. The capability to effect bending of a ceramic element in a specific direction is well known in the art.

An actuator as claimed herein, i.e. e.g. as obtainable by combining the 8 portions as shown in FIG. 1 has the capability of moving in an S-shape when each portion is activated individually in a specific sequence. Particularly, the tool end 4 can be moved in a Cartesian space relative to the mount end. In the following, we will refer to this structure as an "S-morph" actuator.

Figure 2:
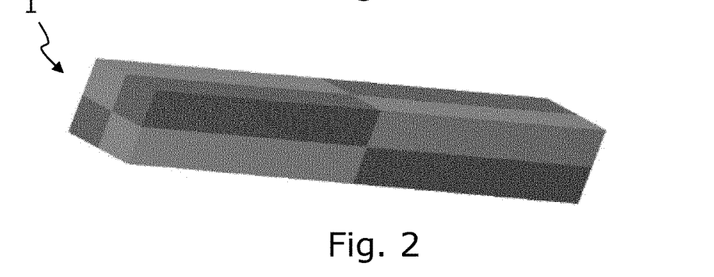
FIG. 2 illustrates the actuator in a non-exploded view.

FIG. 2 illustrates the assembled actuator with the eight portions. The actuator could be made in one single uniform body, e.g. a body made in one single piece from a ceramic material which is co-fired such that no structural transition can be identified between each portion. Alternatively, the portions are made individually and subsequently joined adhesively.

Figure 3:
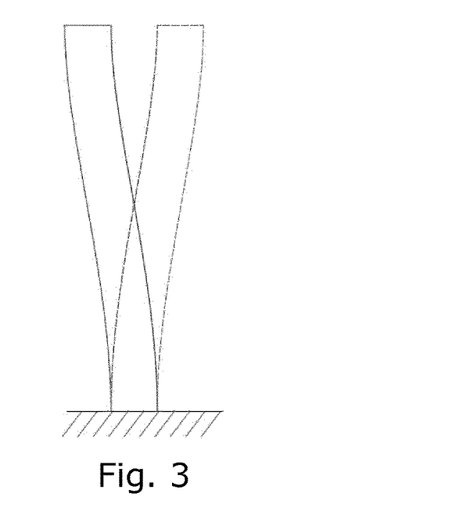
FIG. 3 illustrates schematically the capability of the actuator to move in an S-shape.

FIG. 3 illustrates schematically the S-shaped movement enabled with the S-morph actuator. The movement is obtainable e.g. by use of a power supply which energises the Y and X electrodes in a sequence. An example of a sequence which can move the tool end in a Cartesian X-Y plane can be seen in FIG. 11. This sequence provides a circle movement of the tool end and is herein referred to as a circle-sequence.

FIGS. 4a, 4b, 5a and 5b illustrate an S-morph actuator which is energised according to a sequence by which the tool end moves in a circular pattern. The circle-sequence is suitable for driving a wobble motor since it can cause rotation of the drive ring caused by eccentric movement of the tool end inside the ring.

Figure 5A:
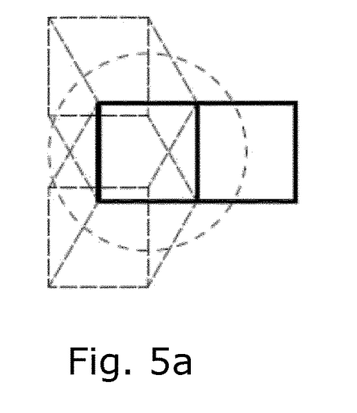
FIGS. 5a and 5b illustrate the actuator in FIGS. 4a, 4b seen from the mount end.
Figure 5B:
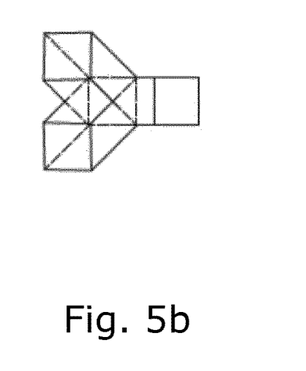
Figure 6:
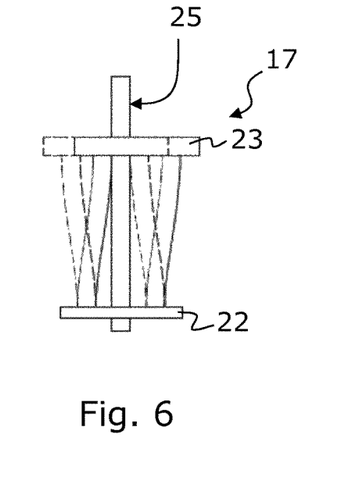
FIGS. 6-9 illustrate a wobble motor comprising 4 actuators of the kind illustrated in FIGS. 1-5.

In FIGS. 4a and 5a, the actuator is moved such that the tool end remains parallel to the mount end, and in FIGS. 4b and 5b, the actuator is moved such that the tool end bends relative to mount end. If such a movement of the actuator is selected in a wobble motor, it may require flexibility in the interface between the tool end of the actuator and the ring. The movement illustrated in FIGS. 4a and 5a will enable a fixed connection between the tool end of the actuator and the ring of a wobble motor.

FIGS. 6-9 illustrate a wobble motor 17 with four actuators 18, 19, 20, 21. The actuators are fixed at the mount end to the base plate 22 and operate with the tool ends on the associated ring 23. In the illustrated embodiment, the tool ends are adhesively joined to a lower surface of the ring 23, however, couplings of various kinds may be used. In other embodiments, interface elements could be interposed between the actuators and the ring e.g. for the purpose of establishing a desired bond between the tool ends of the actuators and the ring or for the purpose of levelling the ring, or for the purpose of providing elastic displacement of one ring relative to the other ring. For that purpose, the interface element may be more easily elastically deformable than the rings. It could e.g. be made from a polymer material.

Figure 7:
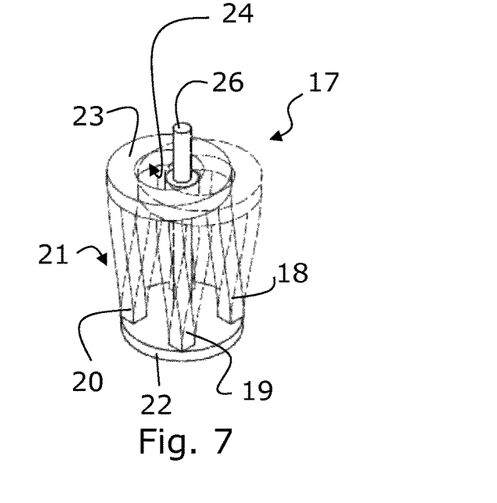
Figure 8:
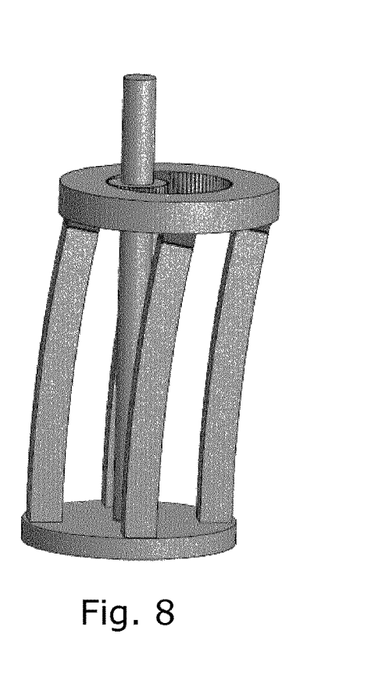
Figure 9:
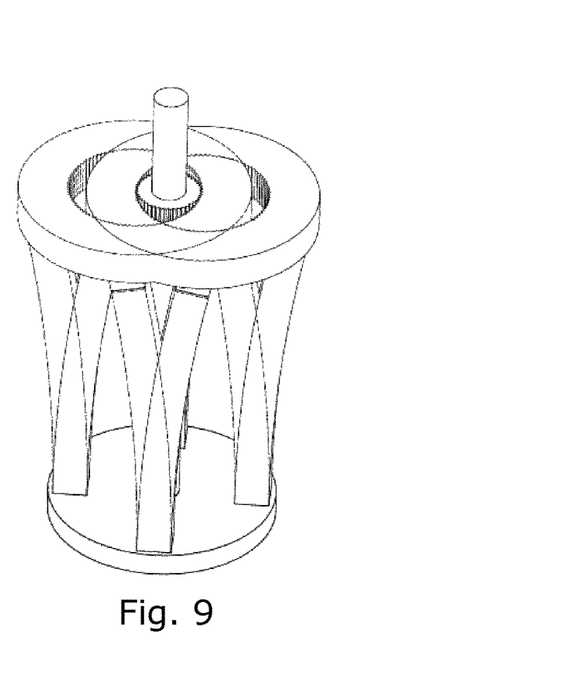
Figure 11:
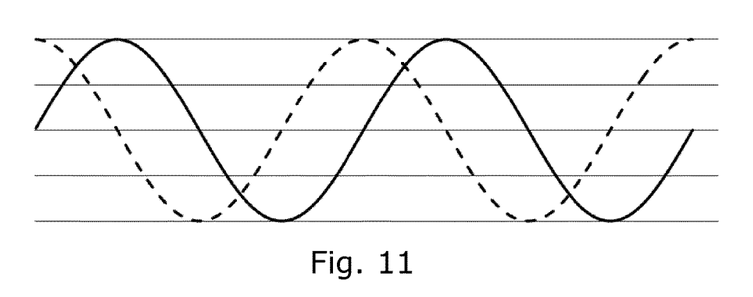
FIG. 11 illustrates a control sequence for a controller or power supply.

By energising the Y and X electrodes in accordance with the circle-sequence as illustrated in FIG. 11, the ring moves in an eccentric shape as illustrated in FIG. 7. Due to interaction between the inner surface 24 of the ring 23 and the outer surface 25 of the shaft 26, the eccentric movement of the ring causes rotation of the shaft 26.

The disclosed wobble motor could be made with any number of actuators, rings, shafts etc. In one embodiment, a number of wobble motors are stacked such that one ring is manipulated by actuators both from below and from above.

Figure 10A:
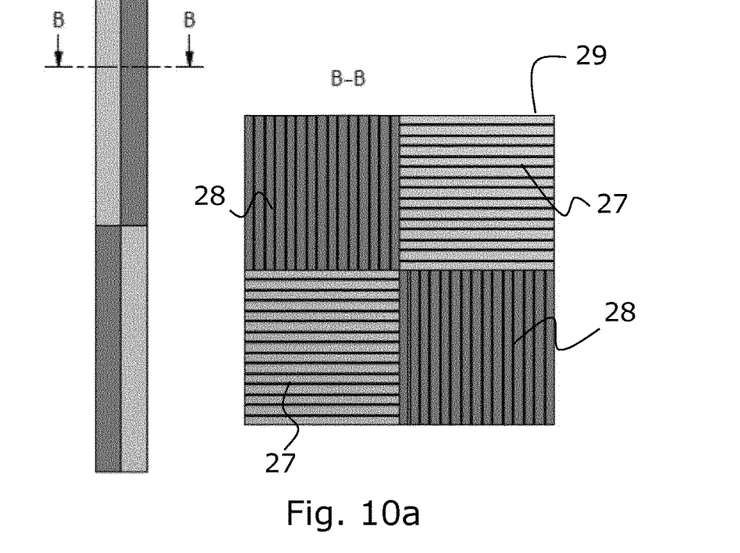
FIGS. 10a and 10b illustrate details of the electrodes in the ceramic body.
Figure 10B:
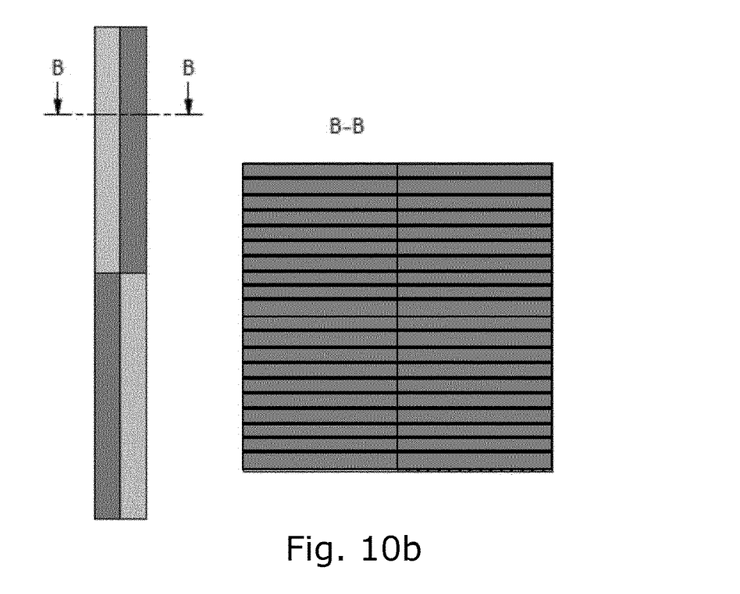

FIGS. 10a and 10b illustrate that the X-electrodes 27 and the Y-electrodes 28 are formed as plane or flat electrode layers in a body 29 of piezo ceramic material. In FIG. 10a, the X-electrodes 27 extend in a direction being transverse to the direction of the Y-electrodes 28, and in FIG. 10b, the direction of the X-electrodes 27 and the Y-electrodes 28 is identical. Other shapes could be considered as long as the shape of the X and Y electrodes provides displacement in transverse directions.

FIG. 11 illustrates a control signal as a function of time (time on the abscissa and voltage of the signal on the ordinate). The full line is the signal which is applied to the X-region and the dotted line is the signal which is applied to the Y-region. The illustrated signal provides a rotation of the tool end, i.e. the tool end follows a circular path. As mentioned previously, we refer to this signal as a circle-sequence.

Figure 12:
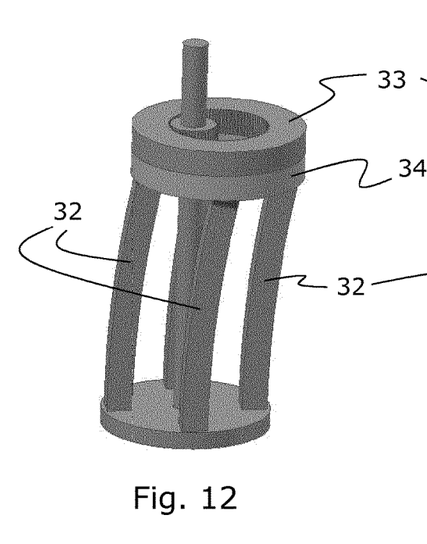
FIGS. 12-13 illustrate details of the interface between the actuators and ring including a separate element interposed between the actuators and ring.
Figure 13:
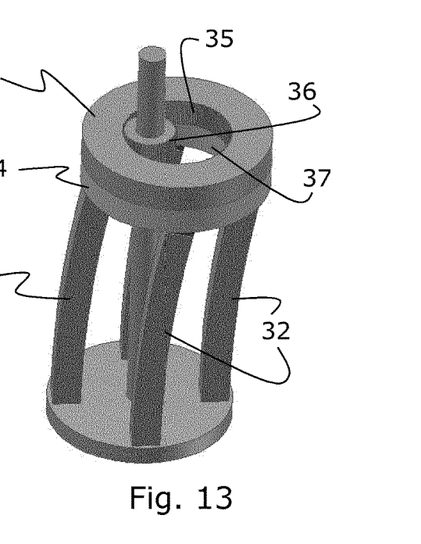

FIGS. 12 and 13 illustrates details of the transition between the actuators 32 and the ring 33. The transition includes a top plate 34 inserted between the ring and the actuators. The transition between the ring and the top plate may be rigid, e.g. obtained by gluing the actuators and top plate rigidly to each other. Alternatively, the transition could, as aforementioned, be elastically deformable such that the deflection of the actuators does not introduce stress in the ring, or vice versa. The top plate 34 may therefore form either a completely rigid coupling transferring the force directly or it may form a flexible coupling which allows re-orientation of the ring relative to the actuator. In fact, any number of interface components similar to the illustrated top plate 34 may be interposed between the actuator and the ring. In FIG. 13 it is more clearly illustrated that the ring 33 has an internal toothing 35 interacting with the external toothing 36 on the shaft, whereas the top plate 34 have no internal toothing on the inner surface 37 thereof, and this internal surface is not intended for interaction with the shaft.

The invention may particularly include the following numbered embodiments:

1. A wobble motor comprising at least one actuator comprising a body extending primarily in a Z direction (2) between opposite mount and tool ends (3, 4), the body forming a first section (13) being offset from a second section (14) in the Z direction, where each section comprises at least one Y-region (5, 7) with a laminate of Y-electrodes interleaved in piezoelectric material in such a way that energising of the electrodes causes deflections in a Y direction being perpendicular to the Z direction; and at least one X-region (6, 8) with a laminate of X-electrodes interleaved in piezoelectric material in such a way that energising of the X-electrodes causes deflections in a X direction being perpendicular to the Y direction and perpendicular to the Z direction, the wobble motor further comprising a wobble structure comprising a shaft (26) being rotatable about a longitudinal axis and at least one ring (23, 33) arranged about the shaft, where each ring is operatively associated with at least one of the actuators (18, 19, 20, 21, 32) such that the ring can be manipulated by movement of the tool end relative to the mount end.

2. A motor according to embodiment 1, where the shaft and the ring are arranged to interact with each other to effect rotation of the shaft upon manipulation of the ring.

3. A motor according to any of embodiments 1-2, where the at least one ring has an inner surface (24) being in contact with an outer surface (25) of the shaft.

4. A motor according to embodiment 3, wherein the inner surface of the ring and the outer surface of the shaft meet in a toothed engagement.

5. A motor according to any of embodiments 1-4, where each ring is rotationally locked relative to the associated actuator.

6. A motor according to any of embodiments 1-5, where the mount end of the body is fixed to a base plate (22) which forms a bearing for the shaft.

7. A motor according to embodiment 6, where at least one of the at least one rings is carried by the base plate via at least one of the at least one actuators.

8. A motor according to any of embodiments 1-7, further comprising a power supply with program code enabling energizing of the X and Y electrodes in such a way that manipulation of the ring by the actuators causes rotation of the shaft.

9. A motor according to embodiment 8, where the program code enables movement of the tool end of at least one of the at least one actuators in a circular pattern.

10. A method for driving a shaft, which comprises the steps of: arranging a ring about a shaft and displacing the ring in an at least partially periodic movement until it engages the shaft and thereby rotates the shaft within the ring, characterised in that the ring is displaced by use of an actuator according to any of embodiments 1-3.

11. A controller for a wobble motor according to any of embodiments 1-10, the power supply having power output means adapted to energize the X-electrodes and the Y-electrodes in a sequence whereby the tool end moves in a Cartesian space being perpendicular to the oblong Z-direction of the actuator.

12. A controller according to embodiment 11, where the power output means is capable of energizing the electrodes according to a programmable and thus repeatable sequence.

13. A controller according to embodiment 12, further comprising program code enabling energizing to effect movement of a connected actuator in a circular shape.

Additionally, the invention may relate to

1. An actuator (1) of the kind used in the wobble motor, particularly to an actuator comprising a body extending primarily in a Z direction (2) between opposite mount and tool ends (3, 4), the body forming a first section (13) being offset from a second section (14) in the Z direction, where each section comprises at least one Y-region (5, 7) with a laminate of Y-electrodes interleaved in piezoelectric material in such a way that energising of the electrodes causes deflections in a Y direction being perpendicular to the Z direction; and at least one X-region (6, 8) with a laminate of X-electrodes interleaved in piezoelectric material in such a way that energising of the X-electrodes causes deflections in a X direction being perpendicular to the Y direction and perpendicular to the Z direction.

2. An actuator according to embodiment 1, further comprising a controller which can control a connected X-energizer and Y-energizer to effect Cartesian movement of the tool end relative to the mount end.

3. An actuator according to embodiment 2, where the controller comprises program code enabling energizing of the X and Y electrodes in such a way that the tool end follows a circular path.

The invention claimed is:

1. A wobble motor, comprising:
at least one solid state actuator, the at least one solid state actuator including a body extending primarily in a Z direction between a mount end and a tool end that is opposite to the mount end; and
a wobble structure including a shaft and at least one ring arranged about the shaft, the shaft rotatable about a longitudinal axis, each ring of the at least one ring operatively associated with the tool end of the at least one solid state actuator such that each ring is configured to be manipulated based on movement of the tool end relative to the mount end,
wherein the body includes a first section and a second section, the first section and the second section having respective longitudinal axes that extend along a common longitudinal axis in the Z direction, each section of the first section and the second section including
a Y-region structure that includes a laminate of Y-electrodes interleaved in piezoelectric material such that the Y-region structure is configured to deflect in a Y direction based on energization of the Y-electrodes, the Y direction perpendicular to the Z direction, and
an X-region structure that includes a laminate of X-electrodes interleaved in piezoelectric material such that the X-region structure is configured to deflect in an X direction based on energization of the X-electrodes, the X direction perpendicular to both the Y direction and the Z direction,
wherein each section of the first section and the second section is configured to simultaneously deflect in both the Y direction and the X direction based on simultaneous energization of at least some of the Y-electrodes of the Y-region structure of the section and at least some of the X-electrodes of the X-region structure of the section.

2. The wobble motor according to claim 1, wherein the shaft and the at least one ring are configured to interact with each other to induce rotation of the shaft based on manipulation of the at least one ring.

3. The wobble motor according to claim 1, wherein the at least one ring includes an inner surface that is in contact with an outer surface of the shaft.

4. The wobble motor according to claim 1, wherein each ring is rotationally locked relative to the at least one solid state actuator.

5. The wobble motor according to claim 1, wherein the mount end of the body is fixed to a base plate which forms a bearing for the shaft.

6. The wobble motor according to claim 5, wherein the at least one ring is carried by the base plate via the at least one solid state actuator.

7. The wobble motor according to claim 1, further comprising:
a controller configured to energize the X-electrodes and the Y-electrodes to induce rotation of the shaft based on manipulation of the ring by the at least one solid state actuator.

8. The wobble motor according to claim 7, wherein the controller is configured to energize the X-electrodes and the Y-electrodes to cause the tool end to follow a circular path.

9. A controller for the wobble motor according to claim 1, the controller comprising:
a power supply configured to energize the X-electrodes and the Y-electrodes in a sequence to cause the tool end to move in a Cartesian space that is perpendicular to an oblong Z-direction of the at least one solid state actuator.

10. The controller according to claim 9, wherein the power supply is configured to energize the X-electrodes and the Y-electrodes according to a programmable and repeatable sequence.

11. A method for driving a shaft, the method comprising:
providing a solid state actuator and a ring arranged about the shaft, the solid state actuator including a body extending primarily in a Z direction between a mount end and a tool end that is opposite to the mount end, the ring operatively associated with the tool end of the solid state actuator such that each ring is configured to be manipulated based on movement of the tool end relative to the mount end; and
displacing the ring by use of the tool end of the solid state actuator concurrently with the ring engaging the shaft such that the shaft rotates within the ring,
wherein the body includes a first section and a second section, the first section and the second section having respective longitudinal axes that extend along a common longitudinal axis in the Z direction, each section of the first section and the second section including
a Y-region structure that includes a laminate of Y-electrodes interleaved in piezoelectric material such that the Y-region structure is configured to deflect in a Y direction based on energization of the Y-electrodes, the Y direction perpendicular to the Z direction, and
an X-region structure that includes a laminate of X-electrodes interleaved in piezoelectric material such that the X-region structure is configured to deflect in an X direction based on energization of the X-electrodes, the X direction perpendicular to both the Y direction and the Z direction,
wherein each section of the first section and the second section is configured to simultaneously deflect in both the Y direction and the X direction based on simultaneous energization of at least some of the Y-electrodes of the Y-region structure of the section and at least some of the X-electrodes of the X-region structure of the section.

12. The method according to claim 11, wherein the displacing includes energizing the X-electrodes and the Y-electrodes to cause the tool end to follow a circular path.

13. The method according to claim 11, wherein the displacing includes displacing the ring based on periodic movement of the tool end of the solid state actuator.

* * * * *